(12) United States Patent
Walz et al.

(10) Patent No.: US 10,461,665 B2
(45) Date of Patent: Oct. 29, 2019

(54) SWITCH DEVICE FOR AN ELECTRIC MOTOR, CONTROL DEVICE AND STEERING SYSTEM

(71) Applicant: Robert Bosch GmbH, Stuttgart (DE)

(72) Inventors: Stefan Walz, Schwäbisch Gmünd (DE); Andreas Speinle, Elzach (DE); Markus Weber, Göppingen (DE); Sylvia Wiedemann, Ludwigsburg (DE); Panagiotis Kosioris, Urbach (DE); Dirk Lamprecht, Stuttgart-Rohr (DE); Alexander Krautstrunk, Durlangen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/086,581

(22) PCT Filed: Feb. 15, 2017

(86) PCT No.: PCT/EP2017/053364
§ 371 (c)(1),
(2) Date: Sep. 19, 2018

(87) PCT Pub. No.: WO2017/178135
PCT Pub. Date: Oct. 19, 2017

(65) Prior Publication Data
US 2019/0103818 A1     Apr. 4, 2019

(30) Foreign Application Priority Data

Apr. 11, 2016   (DE) ........................ 10 2016 106 547

(51) Int. Cl.
*H02M 7/539* (2006.01)
*H02M 7/5387* (2007.01)
(Continued)

(52) U.S. Cl.
CPC ........ *H02M 7/53875* (2013.01); *B62D 5/046* (2013.01); *H02M 7/53803* (2013.01); *H03L 7/06* (2013.01)

(58) Field of Classification Search
CPC ........... H02M 7/5387; H02M 7/53873; H02M 7/53875; H02M 7/53803; H02M 7/539; H02M 7/5395; H03L 7/06; B02D 5/046
See application file for complete search history.

(56) References Cited

U.S. PATENT DOCUMENTS 6,845,309 B2    1/2005   Recker et al.
2004/0264075 A1   12/2004   Kolomeitsev
(Continued)

FOREIGN PATENT DOCUMENTS

DE    35 40 178 A1    5/1987
EP    0 719 473 B1    7/1996
(Continued)

OTHER PUBLICATIONS

International Search Report corresponding to PCT Application No. PCT/EP2017/053364, dated Jun. 6, 2017 (German and English language document) (5 pages).

*Primary Examiner* — Adolf D Berhane
(74) *Attorney, Agent, or Firm* — Maginot, Moore & Beck LLP

(57) ABSTRACT

A switch device for an electric motor includes at least one half-bridge having two semiconductor switches to energize at least one phase of the electric motor on demand. The switch device further includes a drive device assigned to the semiconductor switches and configured to actuate the semiconductor switches in accordance with an activation signal. The driver device includes an oscillator to generate an operating clock frequency, an apparatus to receive a synchronization signal, and a device to adjust the operating clock frequency in accordance with the synchronization signal.

16 Claims, 4 Drawing Sheets

(51) Int. Cl.
*H02M 7/538* (2007.01)
*B62D 5/04* (2006.01)
*H03L 7/06* (2006.01)

(56) References Cited

U.S. PATENT DOCUMENTS

| | | | | |
|---|---|---|---|---|
| 2005/0007050 A1* | 1/2005 | Brenden | ............... | H02P 6/14 |
| | | | | 318/400.21 |
| 2005/0029476 A1* | 2/2005 | Biester | ............ | E21B 33/0355 |
| | | | | 251/58 |
| 2017/0229986 A1* | 8/2017 | Allegrini | ............... | H02P 6/18 |
| 2018/0205266 A1* | 7/2018 | Miyamoto | ............ | H02J 50/10 |
| 2018/0358910 A1* | 12/2018 | Mayr | ................. | B25J 9/0009 |

FOREIGN PATENT DOCUMENTS

| EP | 2 755 316 A1 | 7/2014 |
|---|---|---|
| WO | 2011/115952 A1 | 9/2011 |

\* cited by examiner

SWITCH DEVICE FOR AN ELECTRIC MOTOR, CONTROL DEVICE AND STEERING SYSTEM

This application is a 35 U.S.C. § 371 National Stage Application of PCT/EP2017/053364, filed on Feb. 15, 2017, which claims the benefit of priority to Serial No. DE 10 2016 106 547.1, filed on Apr. 11, 2016 in Germany, the disclosures of which are incorporated herein by reference in their entirety.

The disclosure relates to a switch device for an electric motor, in particular of a steering system of a motor vehicle, with at least one half-bridge having two semiconductor switches for energizing at least one phase of the electric motor on demand, wherein a driver device is assigned to the semiconductor switches, which actuates the semiconductor switches in accordance with an activation signal.

The disclosure also relates to a control device for an electric motor having a plurality of electrical phases, in particular for a steering system of a motor vehicle, which has a switch device for each of the phases of the electric motor as described above, and a control unit which is designed to generate an activation signal to actuate the switch devices.

The disclosure additionally relates to a steering system for a motor vehicle, having a steering handle with at least one steerable wheel, the steering wheel angle of which is adjustable in particular depending on an actuation of the steering handle or an automated steering angle specification, wherein the steering system has at least one electric motor having a plurality of phases for applying a steering torque or support steering torque to the steerable wheel, and with the above-described control device for controlling the phases of the electric motor.

The disclosure also relates to a method for operating a control device for an electric motor having a plurality of electrical phases, in particular as described above, wherein one switch device is present for each of the phases of the electric motor.

BACKGROUND

Switch devices, control devices and steering systems of the above-mentioned type are known from the prior art. To operate an electric motor it is common practice to activate the individual phases of the electric motor by means of semiconductor half-bridges. These half-bridges each have two semiconductor switches, a high side switch and a low side switch, which can be activated by a pulse-width modulation, in order to energize the phase in accordance with the specified pulse-width modulation. By means of a driver device, often referred to as a gate driver, the semiconductor switches are actuated, in order to pass current or to disconnect a flow of current.

To ensure the continuous safe operation of electric motors in safety-critical applications, it is also known to provide and control such electric motors in a redundant manner so that, for example, one phase of the electric motor is provided multiple times. In the field of steering systems, which are designed to provide electric-motor based support for the driver or an electric-motor based steering angle adjustment independently of the driver in an autonomous driving mode, it is known to provide a plurality of phases redundantly and to control each of these phases by means of a separate semiconductor half-bridge. In order that no incorrect moments or the like can occur in normal operation, the semiconductor switches or the semiconductor half-bridges must be switched at the same time. To achieve this, it is known to connect each of the half-bridges, or each of the semiconductor switches, to a control unit separately to feed an activation signal thereto, so that a safe operation is guaranteed even in the event of failure of one of the phases or one of the semiconductor switches. However, this means high wiring costs, which both places constraints on the available installation space as well as leading to unwanted material and assembly costs. A corresponding control device is known, for example, from the patent specification US 2004/0264075 A1.

SUMMARY

The switch device according to the disclosure having the features as disclosed has the advantage that costly cabling for controlling multiple switch devices can be eliminated. To this end, the single switch device is designed in such a way that it itself ensures that it operates at a desired operating frequency or with a desired operating clock frequency, so that less elaborate wiring is necessary. According to the disclosure it is provided that the driver device has an oscillator for generating an operating clock frequency, means for receiving a synchronization signal, and a device for adjusting the operating clock frequency as a function of the synchronization signal. The switch device is thus designed to adjust its operating clock frequency as a function of an externally supplied clock signal, so that when a control device with a plurality of such switch devices is provided, it is ensured that the switch devices actually switch at desired times, so that the redundant phases of the electric motor are switched, for example simultaneously, therefore enabling a fault-free operation of the electric motor.

Adjusting the operating clock frequency as a function of the synchronization signal ensures that the individual switching devices are clocked in parallel with each other and therefore switch in accordance with the activation signal at the same time.

According to a preferred embodiment of the disclosure, it is provided that the device has a counter for detecting an actual operating clock frequency of the oscillator in accordance with the synchronization signal. In particular, it is provided that upon receiving the synchronization signal for the duration of a specifiable time or for the duration of the synchronization signal, the counter counts oscillations of the oscillator and therefore determines the actual operating clock frequency of the oscillator and, in particular, compares it with a pre-defined target operating clock frequency. For this purpose, the switch device advantageously has a non-volatile memory, in which the target operating clock frequency is or can be stored. Depending on the comparison of the actual operating clock frequency with the target operating clock frequency, the operating clock frequency of the oscillator is changed until the actual operating clock frequency matches the target operating clock frequency. This ensures that the switch device is operating at the desired operating clock frequency and can therefore be connected in parallel with other switch devices, as described above. The counter is preferably used not only for synchronization but also for the normal operation of the electric motor. Counting the number of synchronization pulses enables in particular an orientation of the control device to be performed, which determines the state in which the system is located in accordance with the synchronization pulses. As a result, commands or additional commands can be executed depending on the orientation, so that, for example, a given command is executed on each x-th synchronization pulse or micro-tick. This also enables, for example, a delayed activation of the semiconductor switches relative to the synchronization signal.

In accordance with a preferred extension of the disclosure it is provided that the oscillator is designed as a controlled, in particular a voltage-controlled or current-controlled oscillator, and that the device is designed to change an input signal, in particular an input voltage or input current, of the oscillator to adjust its operating clock frequency. The actual operating clock frequency of the oscillator is therefore adjusted by modification of the input signal of the controlled oscillator as described above, in order to achieve the desired operating clock frequency.

It is preferably additionally provided that the driver device has a data bus connection. Via this data bus connection the driver device receives, in particular, the activation signal for switching the semiconductor switches. The connection to the data bus enables a fast and secure transmission of the activation signal. The data bus also enables, in a simple and cost-effective manner, the switch devices to be connected to each other in series, where by the design according to the disclosure of the switch device is guaranteed, according to which the switch devices operate at the same operating clock frequency and therefore the series connection ensures a safe parallel operation of the switch devices.

In particular, it is provided that the driver device is designed to receive and transmit the activation signal in a daisy-chain series circuit. In other words, it is provided that the switch device receives the activation signal and then forwards or can forward it to a further switch device, so that a daisy chain or series connection of a plurality of such switch devices is provided, which allows a simultaneous connection of the semiconductor switches, in particular of redundant phases of an electric motor.

The control device according to the disclosure with the features as disclosed is characterized by one switch device according to the disclosure for each of the phases of the electric motor, and by a control unit, wherein the control unit is designed on the one hand to generate the activation signal and feed it to at least one of the switch devices, and on the other hand, to generate at least one synchronization signal and feed it/them to each of the switch devices. It is also provided here that the control unit, which in particular comprises a microprocessor, generates the activation signal, for example in accordance with the actuation of a steering handle, and feeds it to at least one of the switch devices, in order to operate these accordingly. The control unit therefore feeds the synchronization signal, in particular the synchronization pulse, to each of the switch devices and feeds the activation signal to one or more of the switch devices, in order to ensure an identically clocked activation of the semiconductor bridges. Due to the design according to the disclosure of the switch device, these are matched to each other in their operating clock frequency, so that an advantageous energizing or wiring of the phases of the electric motor is performed.

In particular, it is provided that at least some of the switch devices in a group are connected in series as a daisy chain, in order to pass the activation signal from one switch device to another switch device. In this case, the switch devices are preferably connected in series as a daisy chain in at least two groups, wherein the activation signal is fed in each case to one of the switch devices, or else all switch devices are connected in series as a daisy chain, and the activation signal is fed to only one of the switch devices which forwards it to the following switch device. The design as a daisy chain results in a particularly low cabling overhead for the switch devices, in particular because the activation signal only has to be fed to one of the switch devices. This achieves installation space advantages and reduces manufacturing costs, as previously discussed.

Preferably, it is provided that the control device has twelve of the switch devices for controlling twelve phases of the electric motor, which is designed as a 3-phase electric motor with a 4-fold redundancy. If one of the switch devices fails, for example, the remaining phases can then continue to be operated with the remaining eleven switching devices. As an alternative to the design of the electric motor with 12 phases it is also conceivable to design the electric motor using a plurality of partial motors, which each have, for example, three phases, so that the electric motor has a total of four partial motors, which would also be operable independently of each other provided that they are not mechanically coupled with each other. Furthermore, the electric motor can also have more than 3 phases and/or more or less than four redundancies.

In accordance with a preferred extension of the disclosure only one control unit is provided which is designed to control all switch devices, in particular to apply the synchronization signal to them and feed the activation signal to at least one of the switch devices, as previously described. Alternatively, the control device preferably has at least two control units, each of which is designed to activate a group of switch devices or driver devices for the redundant activation of the phases or phase systems/phase groups, in particular to feed the synchronization signal and, at least to one of the respective group of switch devices, the activation signal. As a result, a continued operation of the electric motor is possible even if one of the control units should fail.

In accordance with a preferred extension of the disclosure it is provided that the respective control unit generates at least one synchronization signal for at least two groups of switch devices, which implements operating clock frequencies or actuations of the semiconductor switches that are temporally offset relative to each other. This achieves a staggered clocking of the electric motor, or of the different phases or partial motors of the electric motor, which means a DC-link capacitor can be implemented in a smaller size, allowing a reduction of the overall size and the production costs. Using the at least one synchronization signal, the information about a staggered control of the semiconductor switches or the half-bridges is provided to the respective switching device.

In particular, it is provided that the respective control unit generates two synchronization signals with synchronization pulses that are temporally offset relative to one another. This allows the temporal offset to be achieved in a simple manner, by the synchronization pulses of the synchronization signals alone. This is used to start the temporally offset output of the pulse patterns in the half-bridges of the at least two groups of switch devices. The temporal offset of the synchronization pulses leads to the desired temporal offset of the pulse patterns between the groups of switch devices or partial motors.

Alternatively, it is preferably provided that the respective control unit generates a synchronization signal with at least one data word detectable by the switch devices, wherein the switch devices perform the actuation of the semiconductor switches in accordance with the data word. There is therefore only one synchronization signal with synchronization pulses, which is fed to both groups of switch devices. The data word which is transferred along with the synchronization signal is detected by the intelligent switch devices. The switch devices of the respective groups are designed to detect and analyze the data word, in order to actuate the semiconductor switches either in synchrony with or delayed with respect to the synchronization pulse. In particular, the data word contains information about which of the switch devices is to operate the semiconductor switches with a delay. This means it can be selectively defined, for example, that a first group of switch devices is clocked such that it is delayed relative to a second group of switch devices, or else activates the phases with a delay.

The steering system according to the disclosure with the features as disclosed is characterized by the control device according to the disclosure. This results in the advantages already mentioned.

The method according to the disclosure with the features as disclosed is characterized in that, on the one hand, an activation signal is generated and fed to at least one of the switch devices, and on the other hand at least one synchronization signal is generated and fed to each of the switch devices. This results in the advantages already mentioned. In particular, the control device is designed to carry out the method according to the disclosure.

Further advantages and preferred features and feature combinations result in particular from the disclosure.

BRIEF DESCRIPTION OF THE DRAWINGS

In the following the disclosure will be explained in further detail based on exemplary embodiments. The figures show.

DETAILED DESCRIPTION

Figure 1:
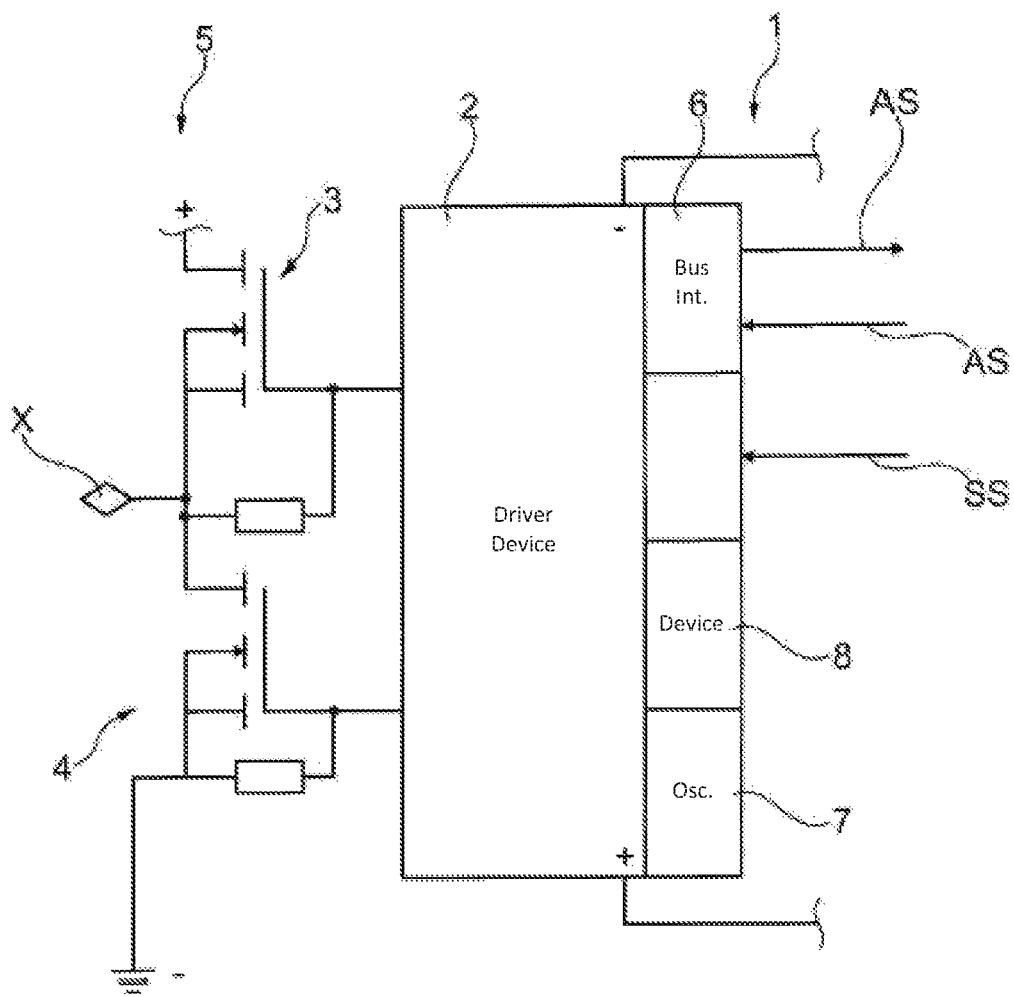
FIG. 1 an advantageous switch device in a simplified representation.

FIG. 1 shows a simplified representation of a switch device 1, which is designed to activate or energize a phase X of an electric motor on demand. The switch device is designed to implement a pulse-width modulation method to energize the phase X. To this end, the switch device 1 has a driver device 2 to operate two semiconductor switches 3, 4 which are interconnected to form a half-bridge 5, by pulse-width modulation in accordance with an activation signal S, thus to switch them between a conducting and non-conducting state. The semiconductor switch 3 is designed as a high-side switch and connected to a supply voltage (+), and the semiconductor switch 4 is designed as a low-side switch, which is connected to ground (−).

To receive the activation signal S the switch device 1 has a BUS interface 6, by means of which the switch device 1 can be connected to a data bus, in particular of the motor vehicle. The interface 6 is designed to receive and to forward the activation signal S, as indicated by arrows. Furthermore, the driver device 2 has an oscillator 7, which is controlled, in particular voltage-controlled or current-controlled, and defines an operating clock frequency of the switch device 1. Depending on its input signal, in particular input voltage or input current, the oscillator 7 therefore changes the operating clock frequency. Furthermore, the switch device 1 has means for receiving a synchronization signal SS, wherein the synchronization signal SS is fed by an external device which, for example, also generates the activation signal AS.

The means have in particular an additional BUS interface, or form part of the BUS interface 6.

Furthermore, the switch device 1 has a device 8, which is used to determine the actual operating clock frequency of the oscillator 7 in accordance with the received synchronization signal SS, and in the event of a deviation from a target operating clock frequency to change the input voltage of the oscillator 7 in such a way that the actual operating clock frequency matches the target operating clock frequency.

This ensures that the switch device 1 can be synchronized to an operating clock, in particular offering an advantage when a plurality of such switch devices 1 is used to control a plurality of phases of an electric motor, as will be discussed in more detail below. In particular, the number of terminals of the switch device 1, in particular microcontroller terminals, is limited to four. Therefore, simply designed switch devices 1 are provided, which in this respect form intelligent half-bridges 2. In particular, a first terminal is provided for receiving the synchronization signal SS, a second terminal for receiving the activation signal AS, a third terminal for forwarding the activation signal AS and a fourth terminal for receiving the operating clock frequency. In particular, the driver device 2 has a microcontroller, which receives and analyzes the signals and controls or activates the semiconductor switches 3, 4.

Figure 2:
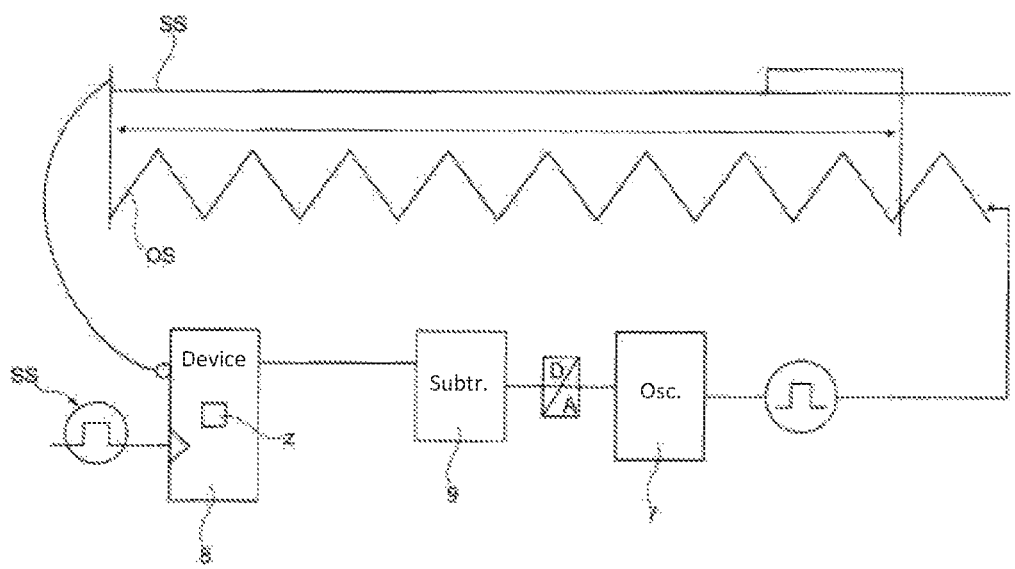
FIG. 2 an operation of the switch device in a simplified representation.

FIG. 2 shows a simplified representation of the synchronization of the switch device 1. The device 8 receives the synchronization signal SS and by means of a counter Z, counts the oscillations of the oscillator 7 on reception of the synchronization signal SS. For example, by means of a subtractor 9, the detected number of oscillations is compared with or subtracted from a target number, wherein the device 8 modifies the input signal of the oscillator 7 as a function of the determined difference, to match the oscillator frequency OS to the target operating clock frequency.

The counter Z is also used to perform an orientation, by the number of synchronization pulses of the synchronization signal being counted and monitored. This enables required control commands to be carried out upon predetermined synchronization pulses. In particular, for example a delayed activation of the semiconductor switches 3, 4 can be carried out.

Figure 3:
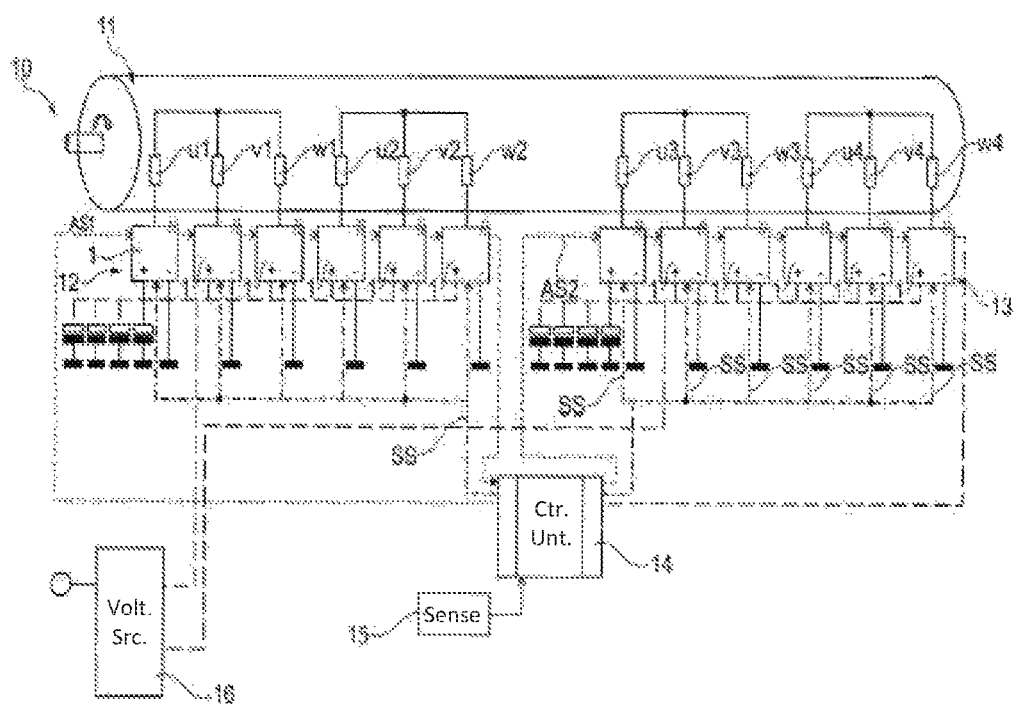
FIG. 3 a control device for an electric motor of a steering system.

FIG. 3 shows a control device 10, in which the advantageous switch device 1 is used. The control device 10 is designed to activate an electric motor 11, or three phases U, V, W of the electric motor 11. The electric motor 11 has the phases U, V, W four times, thus four phase systems, so that it ultimately comprises twelve phases which can be controlled independently of each other, in each case by means of a switch device 1, as described earlier. The phase system consisting of the phases U, V, W is thus implemented in the electric motor with multiple redundancy, wherein the activation by the control device 10 is correspondingly redundantly designed.

As previously described, each of the phases U, V, W, which are divided into the four groups/systems U1, V1, W1; U2, V2, W2; U3, V3, W3 and U4, V4, W4, are each assigned to one of the switch devices 1. The phase X shown in FIG. 1 is thus replaced by one of the phases U1 to W4.

The switch devices 1 are also grouped together, wherein the switch device 1 which is assigned to the phases U1, V1, W1, U2, V2 and W2 form a first group 12, and the switch device 1 which is assigned to the remaining phases, form a group 13. The switch devices of the respective group 12 and 13 are connected to each other in series as a daisy chain, wherein the BUS interfaces are designed to forward the received activation signal AS to a following switch device 1 of the group. The switch devices 1 can be connected to each other and to the control device 10 by means of SPI or SWR interfaces.

The activation signal AS is generated by a control unit for both groups as activation AS_1 or AS_2. In the present case, the control device 10 and the electric motor 11 are a component of a steering system of a motor vehicle, not shown in detail here, so that the control unit 14 generates the activation signal AS in particular in accordance with the operation of a steering handle, in particular the steering wheel of the motor vehicle, in order to generate, using the electric motor 11, a supportive steering moment or a motorized steering moment overriding the manual steering torque.

The control unit 14 is advantageously connected to a rotor angle sensor 15, which monitors the rotor angle of the electric motor 11 to ensure a correct activation of the electric motor 11.

The control unit 14 generates both the activation signal AS and the synchronization signal SS. While the activation signal AS_1/AS_2 is fed to only one switch device 1 of the respective group 12, 13, which the activation signal AS_1/AS_2 then forwards to the following switch device 1 in the respective group, the synchronization signal SS is fed directly to each switch device 1 in order to perform a synchronization of the switch devices 1 with respect to each other. In the present case, a separate synchronization signal SS is fed to each group 12, 13. The switch devices 1 are additionally connected to a voltage source 16, such as a motor vehicle battery, from which the energy is drawn for energizing the phases U1 to W4.

The advantageous design of the control device 10 means that the cabling requirements for activating and synchronizing the switch device 1 are kept to a minimum and production costs and installation costs can thereby be reduced. At the same time, a high degree of redundancy of the activation of the electric motor 10 is ensured, which guarantees the continued operation of the electric motor 11 even in the event of a failure of a phase or phase system. Due to the fact that the switch devices 1 are additionally implemented in two groups to form two series circuits or daisy chains, even if the forwarding of the activation signal AS fails in one of the groups the continued operation of the other group is possible and the probability of failure of the overall system is thereby reduced.

As an alternative to the exemplary embodiment shown it is also conceivable that all switch devices 1 are grouped together in a single group, so that a single activation signal AS from the control unit 10 is sufficient to activate the switch devices 1 and is routed through all switch devices 1, so that all switch devices 1 are connected in series.

Figure 4:
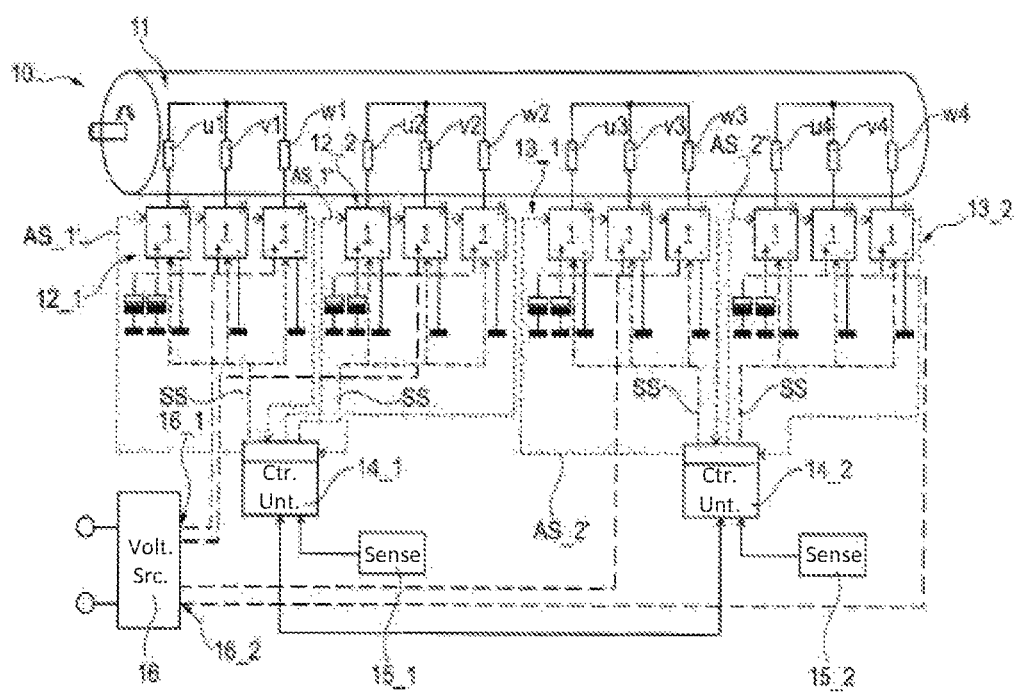
FIG. 4 another exemplary embodiment of the control device.

FIG. 4 shows a further exemplary embodiment of the steering system or control device 10, wherein elements known from the preceding exemplary embodiment are labelled with the same reference numerals. The discussion will focus primarily on the differences.

In contrast to the preceding exemplary embodiment, in this case it is provided that the daisy chains or series circuits of the switch devices 1 are further sub-divided, so that four groups 12_1, 12_2, 13_1 and 13_2 of switch devices 1 are formed.

Two of the groups 12_1, 12_2 or 13_1, 13_2 are each connected to a control unit 14' or 14" respectively. The two control units 14' and 14" are also connected to each other by a connection interface. The control units 14', 14" are designed in accordance with the control unit 14 and each activate two of the groups 12_1, 12_2 or 13_1, 13_2 by feeding an activation signal AS_', AS_1'', AS_2', AS_2'' to each group and feeding the synchronization signal SS to each switch device of the two assigned groups, wherein signals of the rotor angle sensors 15_1, 15_2, also provided redundantly, are also taken into account. Here also, in this case a separate synchronization signal SS is fed to each group 12_1, 12_2, 13_1, 13_2 to increase the redundancy. The redundancy of this control device 10 is thus increased further relative to that of the previous exemplary embodiment, because here a separate activation signal is generated for each phase group.

FIG. 4 also shows that a redundant power supply of the switch devices 1 or the electric motor 11 is provided. To this end, the voltage source 16 has two terminals 16_1 and 16_2. Alternatively, it can be provided that two separate voltage sources are provided, each of which is connected to one of the groups 12, 13. A redundant power supply of the control units 14_1 and 14_2 is therefore provided. The control units 14_1 and 14_2 in this case are connected in particular by two separate BUS systems to the switch devices 1 of the groups 12_1, 12_2, 13_1 and 13_2 assigned to them, thus ensuring an increased safety against failure.

According to an advantageous extension of the steering system, the phase groups of the electric motor 11 are activated with a temporal offset relative to each other, which enables the DC link capacitors to be reduced in size, leading to a reduction of the overall size and the production costs.

This is achieved by the fact that the partial motors or the phase groups are operated offset relative to each other by means of at least one synchronization signal SS, wherein the number of the synchronization signals SS is given by the topology of the selected control device 10 according to the previously described exemplary embodiments.

If the control device 10 has only one control unit 14, for example, as shown in FIG. 3, wherein all switch devices 1 are connected in series, then the control unit generates in particular only one synchronization signal SS with a data word, which is received and evaluated by the intelligent switch devices 1, wherein in accordance with the received data word these activate the respective semiconductor switches 3, 4, if appropriate in a time-delayed manner, so that for example, two of the phase systems are activated or energized with a time delay relative to the remaining two phase systems. The data word in this case is generated in such a way that it contains, in particular, an indication as to which of the phase systems will be activated with a time delay. The micro-controllers of the switch devices 1 then automatically activate the respective semiconductor switches in a delayed or non-delayed manner.

Alternatively, in the case of a topology as shown in FIG. 3, the control unit 14 generates two synchronization signals SS, but these are generated with a temporal offset relative to each other and fed to the groups 12 and 13, so that due to the offset synchronization signal these groups activate or energize the phases of the groups 12 and 13 with a temporal offset relative to each other. Due to the temporal offset of the synchronization pulses therefore, a desired time delay of the pulse patterns between the phase systems or the partial motors is also achieved in a simple manner. In the case of a topology of the control device 10 as shown in FIG. 4, the control units 14_1 and 14_2 are appropriately operated/designed, in each case to generate only one synchronization signal 55 with data word, or in each case two synchronization signals with temporally offset synchronization pulses.

The invention claimed is:

1. A switch device for an electric motor, comprising:
   at least one half-bridge having two semiconductor switches configured to energize at least one phase of the electric motor on demand; and
   a driver device assigned to the two semiconductor switches and configured to actuate the two semiconductor switches in accordance with an activation signal, the driver device including:
      an oscillator configured to generate an operating clock frequency,
      an apparatus configured to receive a synchronization signal, and
      an adjustment device configured to adjust the operating clock frequency in accordance with the synchronization signal.

2. The switch device as claimed in claim 1, further comprising:
   a counter included in the adjustment device and configured to detect the operating clock frequency of the oscillator in accordance with the synchronization signal.

3. The switch device as claimed in claim 1, wherein:
   the oscillator is a voltage-controlled oscillator and the adjustment device is further configured to modify an input voltage of the oscillator to adjust the operating clock frequency.

4. The switch device as claimed in claim 1, wherein:
   the driver device further includes a data bus connection.

5. The switch device as claimed in claim 1, wherein the driver device is further configured to receive and transmit the activation signal in a daisy-chain series circuit.

6. The switch device as claimed in claim 1, wherein the switch device is included in a steering system of a motor vehicle.

7. A control device for an electric motor having a plurality of electrical phases, the control device comprising:
   a switch device for each of the phases of the electric motor, the switch device having:
      at least one half-bridge having two semiconductor switches configured to energize at least one phase of the electric motor on demand; and
      a driver device assigned to the two semiconductor switches and configured to actuate the two semiconductor switches in accordance with an activation signal, the driver device including (i) an oscillator configured to generate an operating clock frequency, (ii) an apparatus configured to receive a synchronization signal, and (iii) an adjustment device configured to adjust the operating clock frequency in accordance with the synchronization signal; and
   at least one control unit configured both to generate the activation signal and to feed the activation signal to at least one of the switch devices and to generate at least one synchronization signal and to feed the at least one synchronization signal to each of the switch devices.

8. The control device as claimed in claim 7, wherein the plurality of electrical phases are of a steering system of a motor vehicle.

9. The control device as claimed in claim 7, wherein:
   at least some of the switch devices in a group are connected in series as a daisy chain in order to pass the activation signal from one of the switch devices to one of the other switch devices.

10. The control device as claimed in claim 7, further comprising:
    twelve switch devices configured to control twelve phases of the electric motor.

11. The control device as claimed in claim 7, further comprising:
    one control unit for all switch devices, or at least two control units for one group of switch devices in each case.

12. The control device as claimed in claim 11, wherein:
    the respective control unit is configured to generate the at least one synchronization signal for at least two groups of the switch devices, and
    the at least one sync signal is configured to implement the operating clock frequencies, temporally offset relative to each other, of the groups or a temporally offset actuation of the semiconductor switches of the groups.

13. The control device as claimed in claim 12, wherein:
    the respective control unit is configured to generate two synchronization signals with synchronization pulses which are temporally offset relative to each other.

14. The control device as claimed in claim 12, wherein:
    the respective control unit is configured to generate only one synchronization signal with at least one data word detectable by the switch devices, and
    the switch devices configured to perform an operation of the semiconductor switches in accordance with the data word.

15. The control device as claimed in claim 7, wherein the control device is included in a steering system for a motor vehicle and the steering system further includes:
    a steering handle; and
    the electric motor having a plurality of phases configured to apply a steering torque or support steering torque to an steerable wheel,
    the control device configured to control phases of the electric motor.

16. A method for operating a control device for an electric motor having a plurality of phases, the control device having at least one control unit and a switch device for each of the phases of the electric motor, each switch device having at least one half-bridge having two semiconductor switches configured to energize at least one phase of the electric motor on demand and a driver device assigned to the two semiconductor switches and configured to actuate the two semiconductor switches in accordance with an activation signal, the driver device including (i) an oscillator configured to generate an operating clock frequency, (ii) an apparatus configured to receive a synchronization signal, and (iii) an adjustment device configured to adjust the operating clock frequency in accordance with the synchronization signal, the method comprising:
    generating, with the at least one control unit, an activation signal;
    feeding, with the at least one control unit, the generated activation signal to at least one of the switch devices;
    generating, with the at least one control unit, at least one synchronization signal; and
    feeding, with the at least one control unit, the generated at least one synchronization signal to each of the switch devices.

* * * * *